(12) United States Patent
Shalom

(10) Patent No.: US 6,298,097 B1
(45) Date of Patent: Oct. 2, 2001

(54) AMPLIFIER WITH WIDEBAND DIGITAL PREDISTORTION

(75) Inventor: Yuval Shalom, Givatayim (IL)

(73) Assignee: Wiseband Communications Inc., Herzeliya (IL)

( * ) Notice: Subject to any disclaimer, the term of this patent is extended or adjusted under 35 U.S.C. 154(b) by 0 days.

(21) Appl. No.: 09/310,013

(22) Filed: May 11, 1999

(51) Int. Cl.[7] .................................................. H04L 25/49
(52) U.S. Cl. ........................ 375/297; 375/296; 375/298
(58) Field of Search ................................. 375/297, 296, 375/243, 254, 295, 298; 708/290, 313, 274, 304, 300; 455/501

(56) References Cited

U.S. PATENT DOCUMENTS

| | | |
|---|---|---|
| 4,291,277 | 9/1981 | Davis et al. .......................... 330/149 |
| 4,700,151 | 10/1987 | Nagata .................................... 332/18 |
| 5,049,832 | 9/1991 | Cavers .................................. 330/149 |
| 5,524,286 | 6/1996 | Chiesa et al. ......................... 455/126 |
| 5,650,758 | 7/1997 | Xu et al. ............................... 330/149 |
| 5,732,333 * | 3/1998 | Cox et al. ............................. 455/126 |
| 5,748,678 * | 5/1998 | Valentine et al. .................... 375/297 |
| 5,760,646 | 6/1998 | Belcher et al. ....................... 330/149 |
| 5,867,065 * | 2/1999 | Leyendecker ........................ 330/149 |
| 5,923,712 * | 7/1999 | Leyendecker et al. .............. 375/297 |
| 6,141,390 * | 10/2000 | Cova .................................... 375/297 |

OTHER PUBLICATIONS

O. Ata, "A Predistort–Linearisation Method for Future Basestation Amplifiers of Cellular Radio," IEEE Globecom Conference, Nov. 18–22, 1996, vol. 3, pp. 1592–1596.

J. Cavers, "Amplifier Linearization Using A Digital Predistorter With Fast Adaptation and Low Memory Requirements," IEEE Transactions on Vehicular Technology, vol. 39, No. 4, Nov. 1990, pp. 374–382.

P. Kenington, "Linearised RF Amplifier and Transmitter Techniques," Wireless Systems International Ltd. Copyright 1998, pp. 1–22.

S. Stapleton Et Al., "An Adaptive Predistorter for a Power Amplifier Based on Adjacent Channel Emissions," IEEE Transactions on Vehicular Technology, vol. 41, No. 1, Feb. 1992, pp. 49–56.

S. Kumar, "Power Amplifier Linearization Using MMICS," Microwave Journal, Apr. 1992, pp. 96, 98, 100, 103, 104.

A. D'Andrea Et Al., "Parallel Amplitude and Phase Predistortion for RF Power Amplifier Linearization," iEEE Transactions 1995, pp. 198–202.

L. Sundstrom Et Al., "Effects of Reconstruction Filters in Digital Predistortion Linearizers for RF Power Amplifiers," IEEE Transactions on Vehicular Technology, vol. 44, No. 1, Feb. 1995, pp. 131–138.

U.S. application Ser. No. 09/226,709, filed Jan. 7, 1999.

* cited by examiner

*Primary Examiner*—Chi Pham
*Assistant Examiner*—Emmanuel Bayard
(74) *Attorney, Agent, or Firm*—Hoffman, Wasson & Gitler,PC; Sanford T. Colb

(57) ABSTRACT

Linearization circuitry for predistortion of an input signal to an amplifier having a given distortion characteristic, including a correction circuit, which receives a stream of samples of the input signal at a high sample rate and which applies a correction to the samples responsive to the given distortion characteristic. The corrected samples are preferably lowpass filtered. A decimation circuit receives the corrected samples from the correction circuit and reduces the sample rate of the stream for output to the amplifier, to a reduced rate substantially less than the high sample rate. The present invention enables significant parts of the circuitry to operate at much lower sample rates that previously achievable and lends itself naturally to parallel implementations.

38 Claims, 4 Drawing Sheets

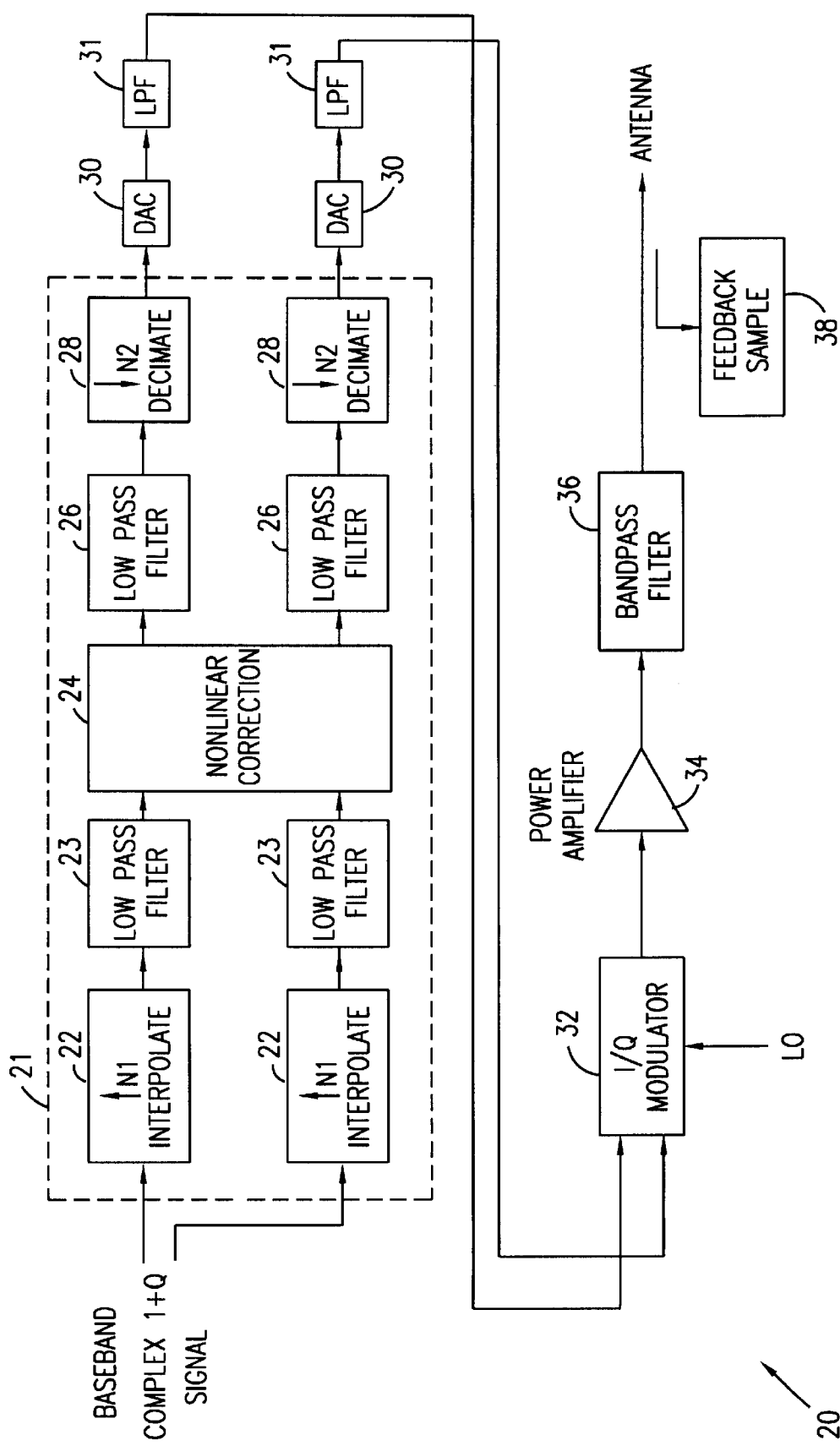

AMPLIFIER WITH WIDEBAND DIGITAL PREDISTORTION

FIELD OF THE INVENTION

The present invention relates generally to high-performance amplifiers for communications applications, and specifically to highly-linear broadband amplifiers.

BACKGROUND OF THE INVENTION

Modern mobile communications systems use multiple channels, closely spaced over an assigned frequency band. In order to avoid intermodulation products and spectral regrowth, both in and out of band, it is essential that RF power amplifier circuits used in these systems be highly linear. A high level of linearity is also required in single-channel transmitters which transmit a wideband, variable-envelope signal, such as a CDMA signal.

A major source of nonlinearity is distortion, which occurs due to nonlinear amplitude and phase response of the amplifier, particularly as power nears the saturation level. Third-order distortion nonlinearities typically give the strongest intermodulation products, but fifth- and even seventh-order products can be significant. Since a typical cellular communications band has a spectral width of around 25 MHz, high-order intermodulation products in a wideband base station amplifier with large channel spacing can create distortion over a band that is more than 150 MHz wide.

One method of correcting for amplifier distortion, and thus improving linearity, is predistortion, in which a controlled, nonlinear distortion is applied to the amplifier input signals. Predistortion circuitry is designed to give nonlinear amplitude and phase characteristics complementary to the distortion generated by the amplifier itself, so that ideally, the distortion is canceled in the amplifier output over the entire signal bandwidth. A feedback connection is generally provided from the amplifier output to the predistortion circuitry, for use in adjusting predistortion coefficients for optimal linearization. Predistortion is often applied to baseband signals, as described, for example, in U.S. Pat. No. 4,291,277, which is incorporated herein by reference. The predistorted signals are then upconverted and fed to the power amplifier. Predistortion may also be combined with other methods of linearization, such as feedforward error correction, as described in U.S. Pat. No. 5,760,646, which is likewise incorporated herein by reference.

Various schemes have been proposed for digital-domain predistortion of the baseband signals. Because of the very high bandwidth of the intermodulation products, as mentioned above, extremely fast, wideband processing circuitry has been required in order to compensate effectively for distortion without causing new problems such as aliasing. The required sampling rate is particularly high when the power amplifier has a significant level of high order (fifth or seventh order) intermodulation response. For example, U.S. Pat. No. 4,700,151, which is incorporated herein by reference, describes a predistortion system that operates on baseband signals. The signals are sampled and then interpolated to generate samples having a higher sample rate, thus providing an extended bandwidth as required for effective predistortion. U.S. Pat. No. 5,650,758, also incorporated herein by reference, describes a pipeline architecture for a wideband digital predistortion circuit. Other predistortion schemes are described in an article by Cavers, entitled "Amplifier Linearization Using a Digital Predistorted with Fast Adaptation and Low Memory Requirements," published in *IEEE Transactions on Vehicular Technology*, vol. 39, no. 4 (November 1990), pages 374–382, which is incorporated herein by reference.

SUMMARY OF THE INVENTION

It is an object of some aspects of the present invention to provide an improved predistortion circuit for use in amplification of radio frequency signals.

It is a further object of some aspects of the present invention to provide a digital predistortion circuit that operates at a reduced sample rate relative to predistortion circuits known in the art.

In preferred embodiments of the present invention, an input signal having a given initial bandwidth is processed by a digital predistortion circuit and is then converted to analog form, upconverted and amplified by a radio frequency (RF) power amplifier. The predistortion circuit receives a stream of samples of the input signal and interpolates the samples to effectively increase the sample bandwidth to an expanded bandwidth at least twice the given bandwidth of the signal. A nonlinear correction is applied to predistort the interpolated samples. The predistorted samples are then low-pass filtered and decimated, so that the bandwidth of the sample stream output by the digital predistortion circuit is again reduced to be on the order of the initial bandwidth.

As a result of this design, digital/analog converters and other circuit elements operating on the output sample stream can work at a substantially slower sample rate and narrower signal bandwidth than in predistortion schemes known in the art, in which the expanded bandwidth is maintained throughout. The present invention can thus be made substantially less costly and complex than such schemes. Alternatively or additionally, it can be made to work with signal bandwidths that known predistortion schemes cannot handle with readily available hardware.

The sample stream that is output by the predistortion circuit is corrected for distortion by the amplifier within the reduced bandwidth of the predistortion circuit output, but not for additional intermodulation products that typically occur over the rest of the expanded bandwidth. Consequently, the power amplifier may generate substantial distortion products in the wings of the extended bandwidth, outside the reduced-bandwidth region in which the distortion is corrected by the predistortion circuit. The uncorrected distortion products in the wings are preferably suppressed by a bandpass filter at the output of the power amplifier, substantially without affecting the amplified signals within the given bandwidth.

Thus, the present invention can be used to correct for distortion that extends over substantially any bandwidth, including intermodulation products both inside and falling partially outside the given bandwidth of the signals. In-band distortion suppression of the amplifier is performed by the predistortion mechanism, whereas the out-of-band distortion is filtered by the band-pass filter. In many applications a band-pass filter or duplexer is already present at the output of the amplifier, so that no extra hardware is needed for this purpose.

In some preferred embodiments of the present invention, the digital predistortion circuit operates on baseband signals, whereas in other embodiments, the predistortion circuit is configured to operate on intermediate frequency (IF) signals. The nonlinear correction may be applied to the signals using any suitable form of digital signal processing, including both real- and complex-domain (I/Q or polar) processing. Preferably, the nonlinear correction is applied using a parallel processing architecture, whereby two or more samples are processed simultaneously, in order to accommodate the high sample rate of the expanded bandwidth.

In some preferred embodiments of the present invention, digital predistortion as described herein is applied in conjunction with other methods of amplifier linearization, such as feedforward correction of the signals. Most preferably, a feedforward amplifier with digital signal equalization is used, as described in U.S. patent application Ser. No. 09/226,709, which is assigned to the assignee of the present patent application and incorporated herein by reference.

There is therefore provided, in accordance with a preferred embodiment of the present invention, linearization circuitry for predistortion of an input signal to an amplifier having a given distortion characteristic, including:

a correction circuit, which receives a stream of samples of the input signal at a high sample rate and which applies a correction to the samples responsive to the given distortion characteristic; and a decimation circuit, which receives the corrected samples from the correction circuit and reduces the sample rate of the stream for output to the amplifier, to a reduced rate substantially less than the high sample rate.

Preferably, the circuitry includes an interpolator, which receives the stream of samples at an input sample rate less than the high sample rate, and which up-samples the stream to the high sample rate.

Further preferably, the correction circuit determines a characteristic of the samples and selects one or more correction coefficients responsive to the characteristic, wherein the one or more correction coefficients preferably include complex coefficients. Preferably, the characteristic of the samples includes a power level thereof.

In a preferred embodiment, the correction circuit includes a plurality of parallel processing channels, to which the samples are routed in alternation, wherein at least two of the plurality of processing channels preferably read the coefficients from a common look-up table. Further preferably, each of the parallel processing channels operates on the samples at a sample rate substantially less than the high sample rate.

Preferably, the decimation circuit includes a low-pass filter and a decimator.

Preferably, the signal output by the circuitry is modulated and amplified by means of the amplifier, and following amplification, the signals are bandpass filtered to suppress distortion products of the amplifier outside a reduced bandwidth corresponding to a Nyquist zone of the reduced sample rate of the filtered stream. Most preferably, the amplifier generates the distortion products over a bandwidth substantially greater than the reduced bandwidth, but generally contained within a high bandwidth corresponding to a Nyquist zone of the high sample rate.

Preferably, the high sample rate is at least twice the reduced sample rate, and more preferably at least four times the reduced sample rate.

There is also provided, in accordance with a preferred embodiment of the present invention, linearized amplification apparatus for amplifying an input signal, including:

digital processing circuitry, which includes:
  a correction circuit, which receives a stream of samples of the input signal at a high sample rate and applies a predistortion correction to the samples; and
  a decimation circuit, which receives the corrected samples from the correction circuit and reduces the sample rate of the stream to a reduced rate substantially less than the high sample rate;

a modulator, which generates a modulated signal responsive to the sample stream from the digital correction circuitry; and an amplifier, which amplifies the modulated signal, such that distortion in a signal band within a Nyquist zone corresponding to the reduced sample rate is substantially reduced.

Preferably, the apparatus includes a low-pass filter, which filters the amplified signal to suppress distortion products outside the signal band.

Further preferably, the predistortion correction is determined responsive to a distortion characteristic of the amplifier.

Preferably, the apparatus includes a digital/analog converter, which converts the digitally-processed samples to analog signals at the reduced sample rate.

There is moreover provided, in accordance with a preferred embodiment of the present invention, a method for linearization of an amplifier having a given distortion characteristic, including:

receiving a stream of samples of an input signal, the stream having a high sample rate;

applying a predistortion correction to the samples responsive to the given distortion characteristic;

reducing the sample rate of the stream of corrected samples to a reduced rate substantially less than the high sample rate; and outputting the corrected, filtered samples for amplification by the amplifier.

Preferably, receiving the stream of samples includes receiving a stream of samples having an input sample rate less than the high sample rate and up-sampling the stream to the high sample rate.

Further preferably, reducing the sample rate comprises low-pass filtering and decimating the corrected samples.

Preferably, outputting the samples includes converting the corrected samples from digital to analog form and modulating the samples at a radio frequency.

The present invention will be more fully understood from the following detailed description of the preferred embodiments thereof, taken together with the drawings in which:

BRIEF DESCRIPTION OF THE DRAWINGS

FIG. 1 is a schematic block diagram illustrating radio frequency amplifier apparatus including digital predistortion circuitry, in accordance with a preferred embodiment of the present invention;

DETAILED DESCRIPTION OF PREFERRED EMBODIMENTS

Figure 2A:
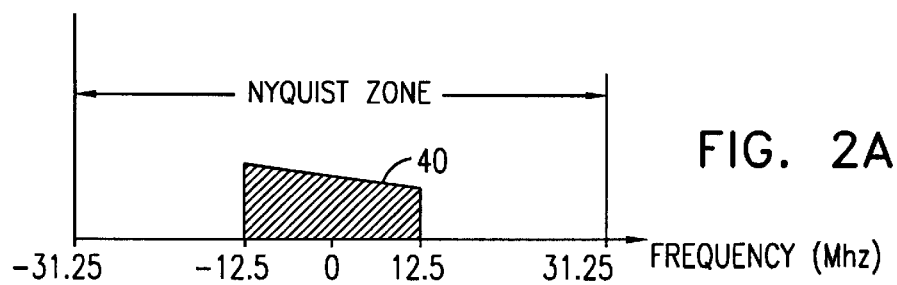
FIGS. 2A–2F are graphs that schematically illustrate spectra of digital signals in the apparatus of FIG. 1.

FIG. 1 is a schematic block diagram illustrating radio frequency amplification apparatus 20, including digital predistortion circuitry 21 and a power amplifier 34, in accordance with a preferred embodiment of the present invention. Apparatus 20 receives baseband signals, preferably in the form of a digital stream of I and Q signal samples having a given initial bandwidth, and generates an amplified radio frequency (RF) output to an antenna. The apparatus is particularly suited for use in the context of a wideband, multi-channel amplifier system in a cellular base station and is preferably, although not necessarily, integrated with other amplification and linearization elements as are known in the art. Most preferably, apparatus 20 is integrated with a feedforward amplifier, and particularly with a feedforward amplifier that includes digital equalization, as described in the above-mentioned U.S. patent application.

The I and Q baseband signals are input to respective interpolators 22, which up-sample the signals by an interpolation ratio $N_1$, wherein preferably $N_1=2$ or 4, and are then filtered by low-pass filters 23. For each pair of samples, a nonlinear corrector 24 determines a power level and, optionally, other signal characteristics, such as the phase, and applies a predistortion correction responsive to a measure of the distortion introduced by amplifier 34. The interpolation performed before nonlinear correction effectively expands the processing bandwidth of the correction. Such expansion is generally needed to satisfy the requirement that the predistorted signals be band-limited to within the (expanded) bandwidth in which the nonlinear correction is being performed. Otherwise, aliasing products may be produced. In some applications, however, a certain amount of aliasing is permitted, in which case the predistorted signal may have some spectral density outside the expanded bandwidth, as long as it is no greater than the permitted level.

Generally, the nonlinear correction is based on a function which is inverse to the nonlinear distortion of the amplifier. Preferably, the appropriate correction is based on coefficients read from a look-up table (LUT), whose contents are calculated and updated responsive to a feedback sample 38 taken from the amplifier output, as is known in the art. Suitable methods for generating predistortion coefficients are described, for example, in the references cited in the Background of the Invention. Although in preferred embodiments described hereinbelow, the predistortion coefficients are selected based on the signal power, substantially any suitable predistortion function may be used for this purpose. For instance, nonlinear corrector 24 may calculate both magnitude and phase of each complex sample (I,Q pair) and use a two-dimensional LUT to generate correction coefficients as a function of both amplitude and phase. Alternatively, an estimated predistortion polynomial or other computed function may be used instead of a look-up table.

Following nonlinear correction, the samples are filtered by low-pass filters 26 and then are decimated by decimators 28 with a decimation ratio $N_2$. Although filters 26 and decimators 28 are shown in the figure as separate blocks, it is also possible to implement them in a common filter unit for each of the I and Q channels. Preferably, the decimation ratio $N_2$ is the same as $N_1$, the ratio used in interpolators 22, so that the output sample rate of predistortion circuitry 21 is reduced to be the same as the input sample rate. The output samples are converted to analog form by digital/analog converters (DACs) 30 and filtered by analog low-pass filters 31. The reduced output sample rate allows output circuits of predistortion circuitry 21 to be simplified, and similarly reduces substantially the sample rate at which the DACs must operate. In this respect, the present invention differs substantively from digital predistortion schemes known in the art, such as that described in U.S. Pat. No. 4,700,151, in which the full, interpolated sample rate used in predistorting the signals is maintained, and very fast digital/analog conversion is required.

Alternatively, it is possible, and sometimes desirable, to use an interpolation ratio $N_1$ which is different from the decimation ratio $N_2$. Having a large interpolation ratio and lower decimation ratio, for example, enables predistortion circuitry 21 to suppress some out-of-band distortion products in addition to the in-band products. The interpolation and decimation ratios may be fixed or variable according to the implementation.

The predistorted analog baseband signals output by filters 31 are upconverted to the desired radio frequency by an I/Q modulator 32, which is driven by a local oscillator. The modulated signals are then amplified by power amplifier 34. On account of the predistortion effected by circuitry 21, the output of amplifier 34 is largely free of intermodulation distortion products in and near the frequency band of the modulated signals themselves. Amplifier 34 may also generate distortion products farther outside the signal frequency band, which are not affected by circuitry 21 on account of the limited output sample rate of the circuitry. These out-of-band products are substantially suppressed by a bandpass filter 36 following the amplifier.

Reference is now made to FIGS. 2A–2F, which are spectral graphs that schematically illustrate frequency-domain operation of circuitry 21. In a preferred embodiment of the present invention, the baseband signals input to the circuitry cover a spectral band 40 of 25 MHz (±12.5 MHz), as is typical in cellular systems. The signals are sampled at a rate of 62.5 Msps (million samples per second), so that the Nyquist bandwidth of the complex, sampled signals is 31.25 MHz, giving a "Nyquist zone" of ±31.25 MHz as shown in FIG. 2A.

Figure 2B:
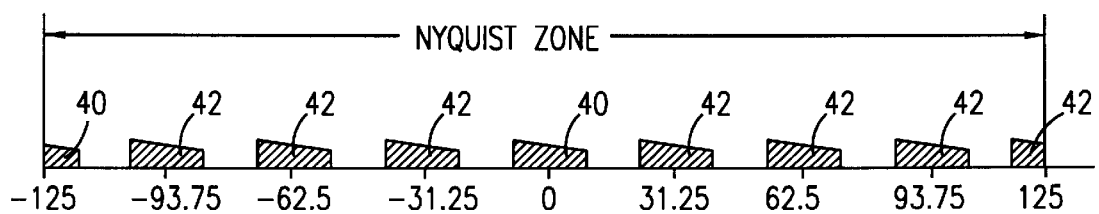
Figure 2C:
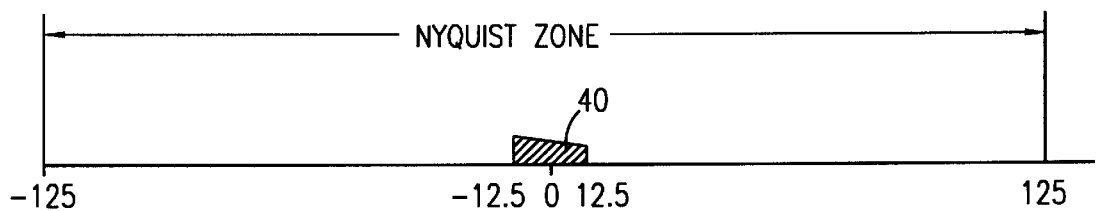
Figure 2D:
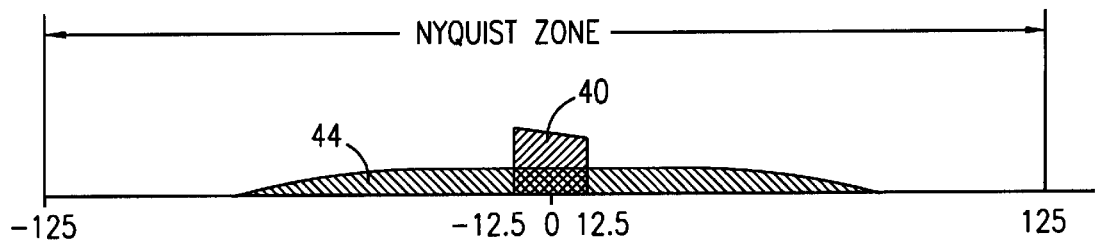

FIG. 2B shows the spectrum of the samples following up-sampling in interpolators 22, wherein a value of $N_1=4$ is taken. The Nyquist zone now expands to ±125 MHz due to the up-sampling, and a comb of signal replicas 42 is formed alongside band 40. Low-pass filters 23 remove the undesired replicas, but leave band 40 in the expanded Nyquist zone, as shown in FIG. 2C.

The effect of nonlinear corrector 24 is to generate a broad predistortion band 44 which is generally inverse to the nonlinear distortion of the power amplifier. The wings of band 44 typically extend well beyond the ±31.25 MHz Nyquist zone of the input signals. Therefore, if the predistortion were imposed without first up-sampling and interpolating the signals, the signals would be irretrievably distorted by aliasing effects.

Figure 2E:
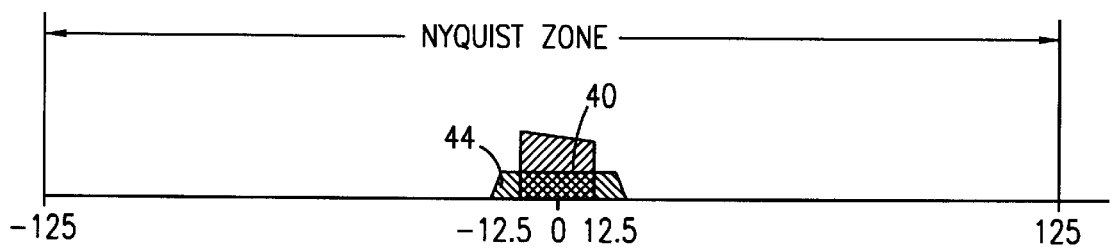
Figure 2F:
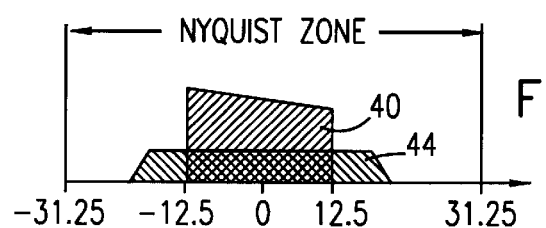

After the nonlinear correction has been applied by corrector 24, however, it is possible to low-pass filter the predistorted signal, as illustrated in FIG. 2E. Thus, most of the out-of-band portion of signal 44 is removed, except for a portion overlapping with or adjacent to the frequencies of band 40. The effect of decimators 28 is then to reduce the sampling rate, i.e., to narrow the Nyquist zone back down to ±31.25 MHz, as shown in FIG. 2F. DACs 30 can thus operate at 62.5 Msps, which is a rate can be achieved by inexpensive, commonly-available commercial components.

Figure 3A:
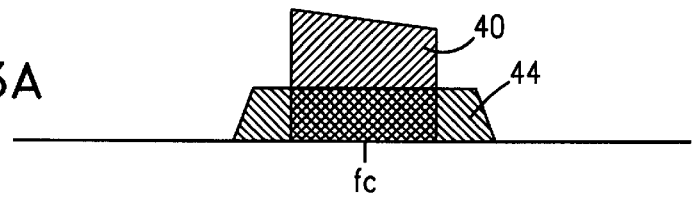
FIGS. 3A–3D are graphs that schematically illustrate spectra of analog signals in the apparatus of FIG. 1.
Figure 3B:
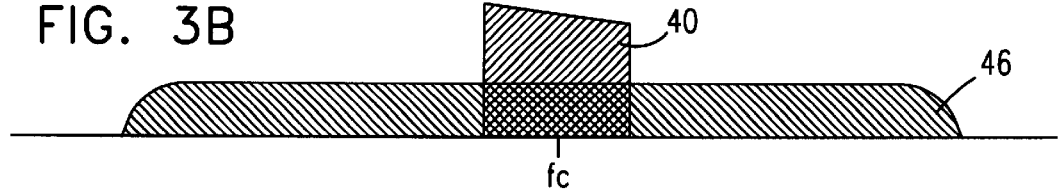
Figure 3C:
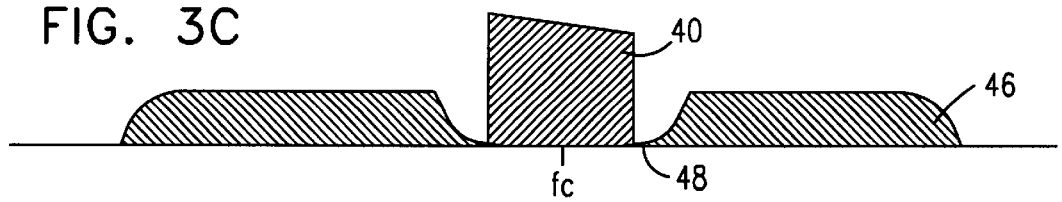
Figure 3D:
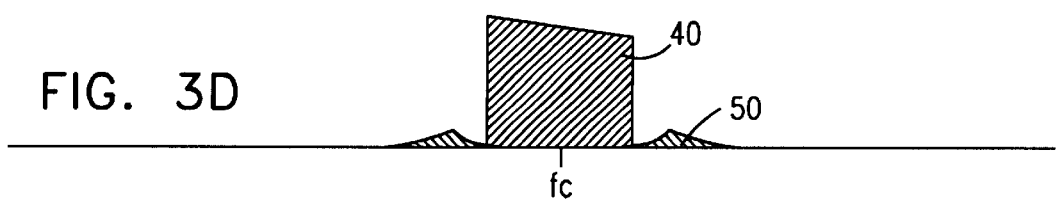

FIGS. 3A–3D schematically illustrate spectra of analog signals in apparatus 20, following the digital correction applied by circuitry 21. FIG. 3A shows the spectrum of the signals following D/A conversion by DACs 30 and upconversion to a carrier frequency $f_c$ by modulator 32. For comparison, FIG. 3B shows the spectrum of amplified signals that would be produced by power amplifier 34 in the absence of predistortion. A broad distortion band 46 is superimposed on signal band 40. Addition of predistortion band 44 to distortion band 46, however, removes the distortion in a cancellation region 48 that includes band 40 and adjacent frequencies, as illustrated in FIG. 3C.

Finally, the remainder of the wings of band 46 are suppressed by bandpass filter 36, leaving only minimal out-of-band distortion 50, without substantially affecting the amplified signal in band 40. Apparatus 20 thus achieves linearization of output signals comparable to or better than that of digital predistortion systems operating at the full, up-sampled bandwidth throughout.

Figure 4:
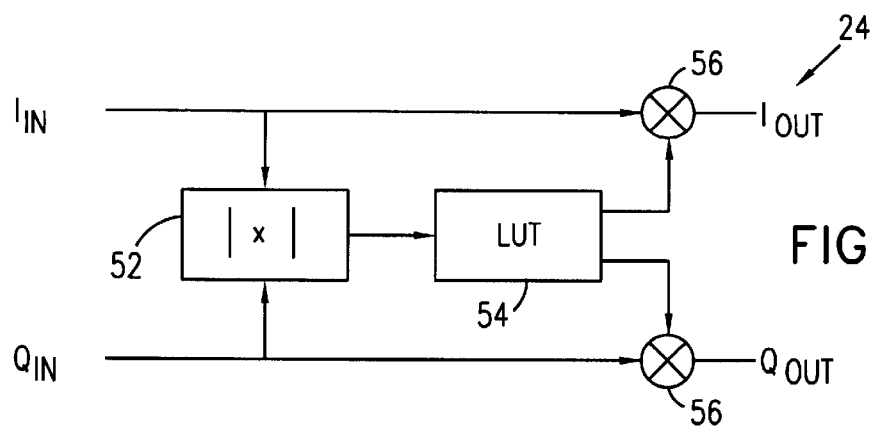
FIG. 4 is a schematic block diagram illustrating a non-linear correction circuit for use in the apparatus of FIG. 1, in accordance with a preferred embodiment of the present invention.

FIG. 4 is a block diagram that schematically illustrates nonlinear corrector 24, in accordance with a preferred embodiment of the present invention. Each pair of I and Q samples provided by interpolators 22 is evaluated to determine the instantaneous signal power by an absolute value block 52. The power determination is used to select a pair of appropriate correction coefficients from a look-up table (LUT) 54. Both the I and Q samples are multiplied by their respective coefficients in multipliers 56 to provide corrected I and Q outputs to low-pass filter 26. The entries in LUT 54 are preferably calculated and updated based on feedback sample 38, as noted hereinabove, and any suitable method known in the art may be used for calculating the coefficients.

Figure 5:
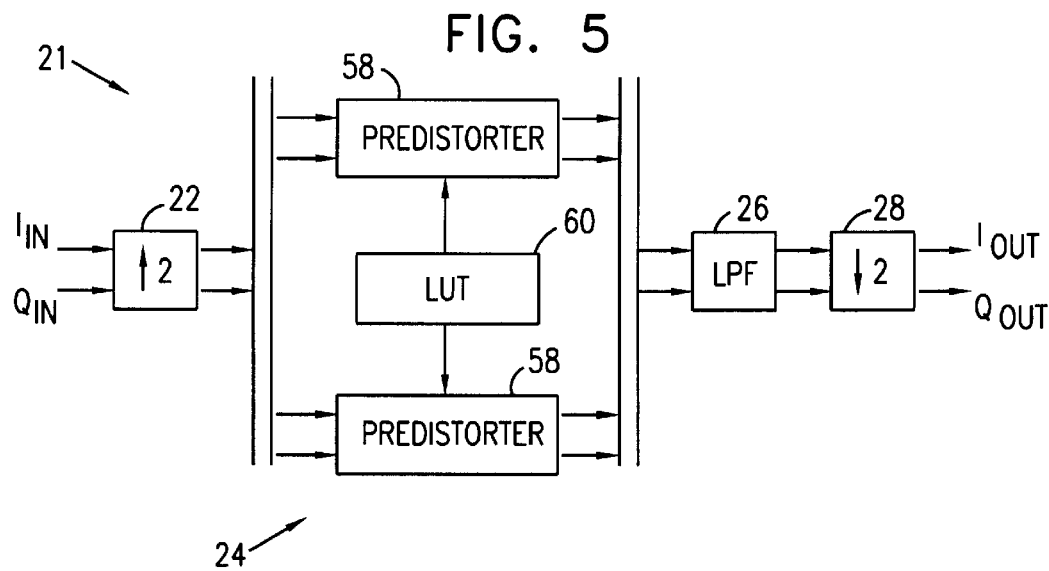
FIG. 5 is a schematic block diagram showing details of predistortion circuitry, in accordance with a preferred embodiment of the present invention.

FIG. 5 is a block diagram that schematically illustrates details of digital predistortion circuitry 21, in accordance with another preferred embodiment of the present invention. In this case, corrector 24 includes two parallel digital predistorters 58, each typically comprising a power evaluator and coefficient multipliers as in the corrector circuit of FIG. 4. The two predistorters preferably share a common LUT 60. Interpolator 22 (shown here for simplicity as a single block, including the function of low-pass filters 23, instead of the group of blocks in FIG. 1) up-samples the I and Q inputs, so that the input sample rate to corrector 24 is 125 Msps (equivalent to a complex bandwidth of ±62.5 MHz). The samples are multiplexed between the two predistorters 58, so that each predistorter need operate only at 62.5 Msps (31.25 Msps×2). The parallel architecture of the circuitry shown in FIG. 5 thus alleviates the need for costly, high-speed digital components.

Figure 6:
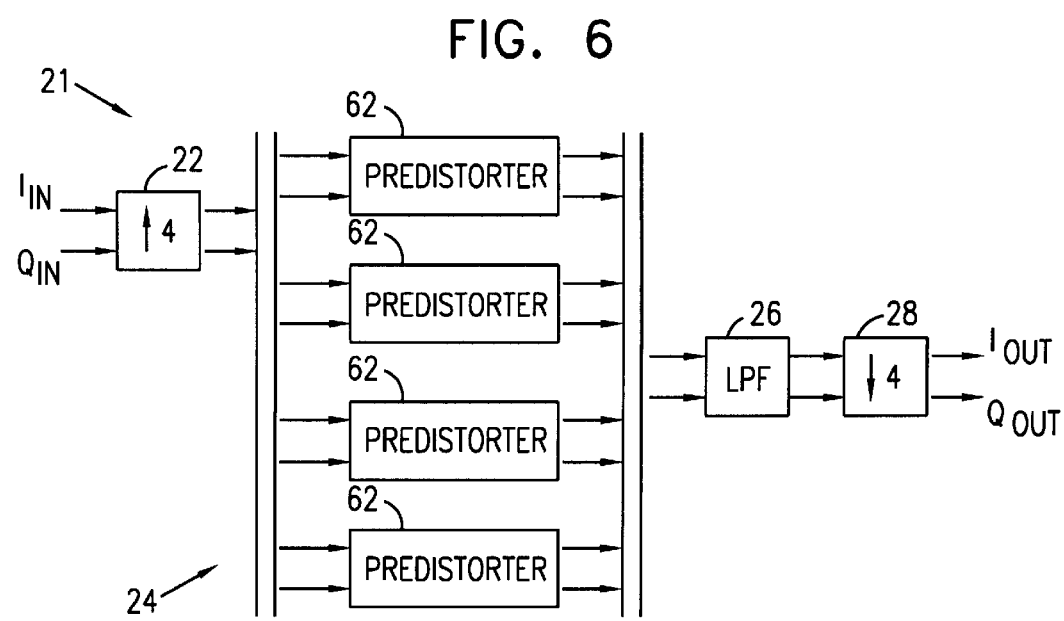
FIG. 6 is a schematic block diagram showing details of predistortion circuitry, in accordance with another preferred embodiment of the present invention.

FIG. 6 is a block diagram that schematically illustrates details of circuitry 21, in accordance with yet another preferred embodiment of the present invention. Here interpolator 22 up-samples the signals by four, to a 250 Msps rate. The samples are multiplexed among four parallel predistorters 62, each operating at 62.5 Msps. It will thus be observed that the parallel processing architecture of corrector 24 may be adapted to operate at substantially any desired sample rate.

Although certain circuit configurations are shown in the figures and described hereinabove by way of illustration, those skilled in the art will understand that the principles of the present invention may be applied using a wide range of different circuit designs, all of which are considered to be within the scope of the present invention. Predistortion circuits based on the present invention may operate in the digital or analog domain, on real or complex (Cartesian or polar) signals, and on baseband or IF signals. They may be integrated with a variety of different amplifier types and linearization architectures and used in different system applications. It will thus be appreciated that the preferred embodiments described above are cited by way of example, and the full scope of the invention is limited only by the claims.

What is claimed is:

1. Linearization circuitry for predistortion of an input signal to an amplifier having a given distortion characteristic, comprising:
    a correction circuit, which receives a stream of samples of the input signal at a high sample rate and which applies a correction to the samples responsive to the given distortion characteristic; and
    a decimation circuit, which receives the corrected samples from the correction circuit and reduces the sample rate of the stream for output to the amplifier, to a reduced rate substantially less than the high sample rate.

2. Circuitry according to claim 1, and comprising an interpolator, which receives the stream of samples at an input sample rate less than the high sample rate, and which up-samples the stream to the high sample rate.

3. Circuitry according to claim 1, wherein the correction circuit determines a characteristic of the samples and selects one or more correction coefficients responsive to the characteristic.

4. Circuitry according to claim 3, wherein the one or more correction coefficients comprise complex coefficients.

5. Circuitry according to claim 3, wherein the characteristic of the samples comprises a power level thereof.

6. Circuitry according to claim 3, wherein the one or more correction coefficients are selected from a look-up table.

7. Circuitry according to claim 3, wherein the one or more corrections coefficients are computed based on an estimated predistortion function.

8. Circuitry according to claim 3, wherein the correction circuit comprises a plurality of parallel processing channels, to which the samples are routed in alternation.

9. Circuitry according to claim 8, wherein at least two of the plurality of processing channels read the coefficients from a common look-up table.

10. Circuitry according to claim 8, wherein each of the parallel processing channels operates on the samples at a sample rate substantially less than the high sample rate.

11. Circuitry according to claim 1, wherein the decimation circuit comprises a low-pass filter and a decimator.

12. Circuitry according to claim 1, wherein the signal output by the circuitry is modulated and amplified by means of the amplifier, and wherein following amplification, the signals are bandpass filtered to suppress distortion products of the amplifier outside a reduced bandwidth corresponding to a Nyquist zone of the reduced sample rate of the filtered stream.

13. Circuitry according to claim 12, wherein the amplifier generates the distortion products over a bandwidth substantially greater than the reduced bandwidth, but generally contained within a high bandwidth corresponding to a Nyquist zone of the high sample rate.

14. Circuitry according to claim 1, wherein the high sample rate is at least twice the reduced sample rate.

15. Circuitry according to claim 14, wherein the high sample rate is at least four times the reduced sample rate.

16. Linearized amplification apparatus for amplifying an input signal, comprising:
    digital processing circuitry, which comprises:
        a correction circuit, which receives a stream of samples of the input signal at a high sample rate and applies a predistortion correction to the samples; and
        a decimation circuit, which receives the corrected samples from the correction circuit and reduces the sample rate of the stream to a reduced rate substantially less than the high sample rate;
    a modulator, which generates a modulated signal responsive to the sample stream from the digital correction circuitry; and an amplifier, which amplifies the modulated signal, such that distortion in a signal band within a Nyquist zone corresponding to the reduced sample rate is substantially reduced.

17. Apparatus according to claim 16, and comprising a low-pass filter, which filters the amplified signal to suppress distortion products outside the signal band.

18. Apparatus according to claim 16, wherein the predistortion correction is determined responsive to a distortion characteristic of the amplifier.

19. Apparatus according to claim 16, wherein the correction circuit determines a characteristic of the samples and selects one or more correction coefficients responsive to the characteristic.

20. Apparatus according to claim 19, wherein the one or more correction coefficients comprise complex coefficients.

21. Apparatus according to claim 19, wherein the characteristic of the samples comprises a power level thereof.

22. Apparatus according to claim 16, wherein the digital processing circuitry comprises a plurality of parallel processing channels, to which the samples are routed in alternation.

23. Apparatus according to claim 16, wherein the digital processing circuitry comprises an interpolator, which receives the stream of samples at an input sample rate less than the high sample rate, and which up-samples the stream to the high sample rate.

24. Apparatus according to claim 16, wherein the decimation circuit comprises a low-pass filter and a decimator.

25. Apparatus according to claim 16, and comprising a digital/analog converter, which converts the digitally-processed samples to analog signals at the reduced sample rate.

26. A method for linearization of an amplifier having a given distortion characteristic, comprising:

receiving a stream of samples of an input signal, the stream having a high sample rate;

applying a predistortion correction to the samples responsive to the given distortion characteristic;

reducing the sample rate of the stream of corrected samples to a reduced rate substantially less than the high sample rate; and outputting the corrected, filtered samples for amplification by the amplifier.

27. A method according to claim 26, wherein receiving the stream of samples comprises receiving a stream of samples having an input sample rate less than the high sample rate and up-sampling the stream to the high sample rate.

28. A method according to claim 26, wherein applying the correction comprises determining a characteristic of the samples and selecting one or more correction coefficients responsive to the characteristic.

29. A method according to claim 28, wherein determining the characteristic of the samples comprises determining a power level of the samples.

30. A method according to claim 28, wherein selecting the one or more correction coefficients comprises selecting complex coefficients.

31. A method according to claim 26, wherein applying the correction comprises routing the samples for correction to a plurality of parallel processing channels in alternation.

32. A method according to claim 26, wherein reducing the sample rate comprises decimating the stream of samples.

33. A method according to claim 26, wherein reducing the sample rate comprises low-pass filtering the stream of samples.

34. A method according to claim 26, wherein outputting the samples comprises converting the corrected samples from digital to analog form and modulating the samples at a radio frequency.

35. A method according to claim 26, and comprising amplifying the samples by means of the amplifier and bandpass filtering the amplified signals to suppress distortion products of the amplifier outside a reduced bandwidth corresponding to a Nyquist zone of the reduced sample rate of the filtered stream.

36. A method according to claim 35, wherein the amplifier generates the distortion products over a bandwidth substantially greater than the reduced bandwidth, but generally contained within a high bandwidth corresponding to a Nyquist zone of the high sample rate.

37. A method according to claim 26, wherein the high sample rate is at least twice the reduced sample rate.

38. A method according to claim 37, wherein the high sample rate is at least four times the reduced sample rate.

\* \* \* \* \*